(12) United States Patent
Charters et al.

(10) Patent No.: US 7,923,071 B2
(45) Date of Patent: *Apr. 12, 2011

(54) PHOTOLITHOGRAPHIC PATTERNING OF POLYMERIC MATERIALS

(75) Inventors: Robert Charters, Palmerston (AU); Dax Kukulj, Ainslie (AU)

(73) Assignee: RPO Pty Limited, Acton, Act (AU)

( * ) Notice: Subject to any disclaimer, the term of this patent is extended or adjusted under 35 U.S.C. 154(b) by 570 days.

This patent is subject to a terminal disclaimer.

(21) Appl. No.: 11/355,668

(22) Filed: Feb. 15, 2006

(65) Prior Publication Data

US 2007/0190331 A1    Aug. 16, 2007

Related U.S. Application Data (60) Provisional application No. 60/653,346, filed on Feb. 15, 2005.

(51) Int. Cl.
- *B05D 3/00* (2006.01)
- *B05D 3/06* (2006.01)
- *B05D 3/10* (2006.01)
- *B32B 27/00* (2006.01)
- *B32B 27/36* (2006.01)

(52) U.S. Cl. ........ 427/336; 427/489; 427/532; 427/553; 428/412; 430/271.1; 430/273.1; 430/306; 522/1

(58) Field of Classification Search .................. 428/412; 522/1

See application file for complete search history.

(56) References Cited

U.S. PATENT DOCUMENTS

| 3,689,264 A | 9/1972 | Chandross |
| 3,809,732 A | 5/1974 | Chandross |
| 3,949,114 A * | 4/1976 | Viola et al. ..................... 428/337 |
| 3,993,485 A | 11/1976 | Chandross |
| 4,126,466 A * | 11/1978 | Roos .......................... 430/271.1 |
| 4,609,252 A | 9/1986 | Wong |

(Continued)

FOREIGN PATENT DOCUMENTS

GB    2290745 A  *  1/1996

(Continued)

OTHER PUBLICATIONS

W.A. McDonald, *Engineered Films for Display Technologies*, Journal of Materials Chemistry, vol. 14, p. 4-10, 2004.

*Primary Examiner* — Michael Kornakov
*Assistant Examiner* — Alexander Weddle
(74) *Attorney, Agent, or Firm* — Miller, Matthias & Hull, LLP (57) ABSTRACT

The invention comprises methods for the photolithographic patterning of features in a photo-curable polymer composition coated onto a plastic substrate. In one embodiment of this invention, the plastic substrate is coated with a reflective film such as a metallic barrier. In another embodiment, the plastic substrate is coated or co-extruded with a polymer barrier layer containing an additive that absorbs the photo-curing radiation. In yet another embodiment the plastic substrate contains an intrinsic additive that absorbs the photo-curing radiation. Combinations of these embodiments are also within the scope of this invention.

The methods of the present invention may be advantageously applied to the fabrication of optical waveguides comprising a photo-curable polymer supported on a plastic substrate, but are applicable to the fabrication of any device or object comprising a photo-curable polymer supported on a plastic substrate.

21 Claims, 7 Drawing Sheets

U.S. PATENT DOCUMENTS

| | | | |
|---|---|---|---|
| 4,645,731 A | 2/1987 | Bayless et al. | |
| 4,838,634 A * | 6/1989 | Bennion et al. | 385/132 |
| 5,054,872 A | 10/1991 | Fan | |
| 5,104,771 A | 4/1992 | Murray | |
| 5,235,541 A * | 8/1993 | Edme et al. | 365/185.04 |
| 5,402,514 A | 3/1995 | Booth | |
| 5,462,700 A | 10/1995 | Beeson | |
| 5,497,445 A | 3/1996 | Imoto | |
| 5,789,015 A * | 8/1998 | Gupta et al. | 427/162 |
| 5,914,709 A | 6/1999 | Graham | |
| 5,985,084 A | 11/1999 | Summersgill | |
| 6,002,828 A | 12/1999 | Hult | |
| 6,054,253 A | 4/2000 | Fardad | |
| 6,114,090 A | 9/2000 | Wu | |
| 6,133,472 A | 10/2000 | Nalewajek | |
| 6,162,579 A | 12/2000 | Stengel | |
| 6,181,842 B1 | 1/2001 | Francis | |
| 6,306,563 B1 | 10/2001 | Xu | |
| 6,351,260 B1 | 2/2002 | Graham | |
| 6,413,699 B1 * | 7/2002 | Kanga | 430/302 |
| 6,429,587 B1 * | 8/2002 | Sugimachi et al. | 313/582 |
| 6,500,887 B1 * | 12/2002 | Tobita et al. | 524/100 |
| 6,512,874 B2 | 1/2003 | Xu | |
| 6,537,723 B1 | 3/2003 | Toyoda | |
| 6,542,684 B2 | 4/2003 | Eldada | |
| 6,599,957 B2 | 7/2003 | Dawes | |
| 6,632,585 B1 | 10/2003 | Nakamura | |
| 6,709,607 B2 | 3/2004 | Hibbs-Brenner | |
| 6,724,968 B2 | 4/2004 | Lackritz | |
| 6,727,337 B2 | 4/2004 | Friedrich | |
| 6,731,857 B2 | 5/2004 | Shelnut | |
| 6,800,724 B2 | 10/2004 | Zha | |
| 6,804,445 B2 | 10/2004 | Edlinger | |
| 6,818,721 B2 | 11/2004 | Zha | |
| 6,832,036 B2 * | 12/2004 | Ghoshal et al. | 385/143 |
| 6,918,666 B2 * | 7/2005 | Sekiya | 347/107 |
| 6,965,006 B2 | 11/2005 | Zha | |
| 7,261,931 B2 * | 8/2007 | Nishikawa et al. | 428/141 |
| 7,521,725 B2 | 4/2009 | Nakagawa | |
| 2003/0128907 A1 * | 7/2003 | Kikuchi et al. | 385/14 |
| 2004/0042753 A1 | 3/2004 | Steenblick et al. | |
| 2005/0003104 A1 * | 1/2005 | Neumann et al. | 427/569 |
| 2006/0068122 A1 * | 3/2006 | Kanouni et al. | 427/532 |

FOREIGN PATENT DOCUMENTS

| | | |
|---|---|---|
| JP | 2001-1661661 | 6/2001 |
| WO | WO 03038141 A2 * | 5/2003 |

* cited by examiner

PHOTOLITHOGRAPHIC PATTERNING OF POLYMERIC MATERIALS

FIELD OF INVENTION

This invention relates to methods of controlling the photolithographic patterning of polymeric materials coated on plastic substrates, and to articles prepared by such methods.

BACKGROUND TO THE INVENTION

The invention will be described with reference to optical waveguides. However it will be appreciated by those skilled in the art that the inventive principles are applicable to the fabrication via photolithography of other devices or objects composed of a polymer curable via a free radical process, e.g. microlens arrays or microfluidic channels. In particular, the inventive principles are important if precise shape control is required.

There are several methods known in the art for fabricating optical waveguides composed of polymeric materials on a substrate. One commonly used method involves moulding and/or embossing, e.g. U.S. Pat. No. 5,985,084. Another involves photolithography followed by an etching process (such as reactive ion etching or plasma etching), e.g. U.S. Pat. No. 5,497,445. Another commonly used method relies on spatially selective refractive index changes resulting from imagewise exposure of a photo-curable material to UV light, e.g. U.S. Pat. No. 3,689,264. Closely related to this method is a "wet etch" process, where a photo-curable material is rendered insoluble by imagewise exposure to UV light, then unexposed material is removed in a subsequent "development" step by flushing with a suitable solvent, e.g. U.S. Pat. No. 4,609,252.

The wet etch method of the prior art, illustrated in FIGS. 1(a) to 1(d), is particularly favoured for fabricating optical waveguides because it has few process steps, is rapid and readily scaleable to high volume production techniques, and requires relatively inexpensive capital equipment. Importantly, it can produce waveguides with precisely positioned and extremely smooth side walls, thereby minimising excess optical loss caused by scattering. After deposition of a UV-curable polymer film 11 on a substrate 12 optionally bearing a lower cladding layer 13, the polymer film is imagewise exposed to UV light 14 through a mask 15 to produce insoluble regions 16. The remainder of the polymer film is removed with a solvent to leave patterned features 17, such as optical waveguide cores, standing on the substrate or the lower cladding layer. Finally, an upper cladding layer 18 can be deposited on top of the patterned features if required. For optical waveguide applications, the materials used for the lower cladding, polymer core and upper cladding layers are usually selected such that they are substantially transparent at the operating wavelength(s), and the lower cladding and upper cladding materials are generally selected such that their refractive indices are less than the refractive index of the polymer core material. The lower cladding layer may be omitted if the substrate material has suitable transparency and refractive index, and the upper cladding layer may be omitted in whole or in part if required. For non-waveguiding applications, only the polymer layer and the substrate may be required. The lower cladding and upper cladding layers may be composed of any material with suitable transparency and refractive index, provided their processing conditions are compatible with the substrate and polymer core materials. Usually they are UV-curable polymers similar to the polymer core layer, deposited for example by spin coating, and cured with UV light.

Photo-curable compositions generally contain at least two components: a reactive component such as a monomer, oligomer or polymer that can be polymerised or cross-linked; and a photo-initiator that initiates the reaction when exposed to radiation (usually UV light, but other forms of sufficiently energetic radiation such as visible light, electrons or X-rays may be employed). Each reactive component molecule must contain at least one substituent capable of undergoing addition polymerisation, typically an ethylenically unsaturated (i.e. C=C) group (e.g. in the case of acrylates, methacrylates, vinyl ethers and styrene) or an epoxy group. For optical waveguide fabrication in particular, free radical initiators (suitable for acrylates, methacrylates and styrene for example) are the most commonly used photo-initiators, although cationic initiators (suitable for epoxies and vinyl ethers for example) have also been used.

Photo-curable compositions used for waveguide fabrication via an imagewise exposure/solvent development process have been developed by several groups. Compositions incorporating free radical photo-initiators include those disclosed by NTT (U.S. Pat. No. 6,632,585), Corning (U.S. Pat. No. 6,114,090, U.S. Pat. No. 6,306,563, U.S. Pat. No. 6,512,874 and U.S. Pat. No. 6,162,579), AlliedSignal (U.S. Pat. No. 5,462,700) and McGill University (U.S. Pat. No. 6,054,253). Compositions incorporating cationic photo-initiators include those disclosed by NTT (U.S. Pat. No. 6,537,723), Shipley (U.S. Pat. No. 6,731,857), IBM (U.S. Pat. No. 5,054,872) and Ericsson (U.S. Pat. No. 6,002,828). AlliedSignal have also disclosed photo-curable compositions incorporating both free radical and cationic photo-initiators (U.S. Pat. No. 6,133,472), exploiting differences in the kinetics of free radical and cationic polymerisation. Many photo-curable compositions suitable for waveguide fabrication via an imagewise exposure/refractive index change process are also known. These mostly use free radical photo-initiators, for example those disclosed by Bell Telephone Labs (U.S. Pat. No. 3,689,264, U.S. Pat. No. 3,809,732 and U.S. Pat. No. 3,993,485), DuPont (U.S. Pat. No. 5,402,514), ICI (U.S. Pat. No. 5,104,771) and Gemfire (U.S. Pat. No. 6,724,968), although Corning have disclosed a system with both free radical and cationic photo-initiators (U.S. Pat. No. 6,599,957).

Regardless of the type of photo-initiator used, or whether a refractive index change or solvent development is used to fix the imagewise exposure, it is generally important that the photo-induced polymerisation reaction occurs only in those regions that have been exposed. Practically, there must be an efficient termination mechanism that stops the reaction at the boundaries between exposed and unexposed regions of the photo-curable material. With isolated waveguides, incomplete reaction termination will blur or roughen the interface between exposed and unexposed regions, thereby causing excessive scattering loss of propagating light. More serious problems occur in optical devices where waveguides are closely spaced (for example in a directional coupler or an array of parallel waveguides) or where waveguides converge to a vertex (for example in a Y splitter or a star coupler). In such devices, incomplete reaction termination can cause partial or complete gap filling or vertex rounding that can compromise the operation of the device. Oxygen is well known to be a highly efficient free radical scavenger, reacting rapidly with free radicals to form less reactive peroxy radicals, thereby causing reaction termination. Although several other variables (including UV intensity and exposure time, inherent monomer reactivity and photo-initiator spectral response) are known to affect the contrast between exposed and unexposed regions, most compositions that are photo-curable via free radical polymerisation rely on the presence of dissolved oxygen as a reaction terminator to assist in providing the required contrast. Additional free radical scavengers such as nitrones (U.S. Pat. No. 6,162,579) may also be added to improve the contrast.

Substrates for optical devices are frequently composed of a rigid material such as silicon, glass, or a ceramic, chosen for factors such as mechanical stability, thermal stability and a high degree of surface smoothness (to minimise scattering loss). However there are many applications where it is preferable for the substrate to be flexible rather than rigid, e.g. for flexible displays (W. A. MacDonald, "Engineered films for display technologies", Journal of Materials Chemistry vol. 14, pp. 4-10, 2004) and flexible optical connectors (U.S. Pat. No. 6,709,607). Flexible substrates are also compatible with reel-to-reel processing, e.g. for waveguide fabrication (U.S. Pat. No. 5,985,084 and U.S. Pat. No. 6,724,968). Flexible substrates are typically composed of a plastic or polymer material, and several types of plastics, including polyethylene terephthalate (PET), polyethylene naphthalate (PEN), polycarbonate (PC), polyvinyl chloride (PVC), polystyrene (PS), acrylates (such as PMMA) and polyimide (PI) have been used as substrates for flat panel displays. Of these, PET is by far the most widely used because it is inexpensive and widely available in large volume (for example as MELINEX® or MYLAR®), with high surface quality (i.e. smoothness). However since PET has a relatively low glass transition temperature (Tg.about.82° C.), other types of (usually more expensive) plastic substrates such as polycarbonate or polyimide (e.g. KAPTON®) may be used if thermal stability is a major concern. It should be noted however that a plastic substrate is not necessarily flexible (e.g. it may be particularly thick and/or semi-rigid), and that plastic substrates may be desirable for other reasons such as transparency, lower weight and lower cost. It will be appreciated that a vast number of plastics are known, many of which could be used as substrates for photo-curable polymers.

Because photolithography/wet etch processing with UV curable polymers is a low temperature process, it would be expected to be readily applicable to plastic substrates, so long as the chosen plastic is resistant to the solvent used in the wet development process. Surprisingly however, when using a photo-curable material comprising a siloxane polymer and a free radical photo-initiator, it was found that changing from a silicon substrate to a plastic substrate affected the polymerisation dynamics of the photo-curable material, such that fine features could no longer be patterned. There is a need then to find a method of avoiding or compensating for this change in polymerisation dynamics.

Any discussion of the prior art herein is not to be construed as part of the common general knowledge of those skilled in the art.

SUMMARY OF THE INVENTION

According to a first aspect, the invention provides a method for patterning a radiation-curable polymer supported on a plastic substrate, comprising the steps of: depositing a radiation-curable polymer onto a plastic substrate; and imagewise exposing to curing energetic radiation, at least a portion of said radiation-curable polymer to provide a cured polymer region, and wherein said plastic substrate is protected from said energetic radiation.

Terms such as "comprise", "comprised", "comprising" and the like are to be construed in an inclusive, rather than exhaustive sense.

Preferably, the plastic substrate may be protected from said energetic radiation by way of i) providing to the substrate an additive designed to absorb said energetic radiation, or ii) providing a barrier layer opaque to said energetic radiation deposited on said substrate or iii) a combination thereof.

In one highly preferred embodiment of the present invention, the plastic substrate is protected from said curing energetic radiation by way of addition to the substrate of an additive selected to absorb said curing energetic radiation.

Preferably, the exposure of said radiation-curable polymer layer to energetic radiation is through a patterning mask to provide at least one cured polymer region and at least one unexposed radiation-curable polymer region. Alternatively, the exposure of said radiation-curable polymer layer to energetic radiation is by a directed beam of said energetic radiation. An additional step of applying a solvent to remove unexposed radiation-curable polymer from said unexposed radiation-curable polymer region may be used. Alternatively, properties of the radiation-curable polymer are chosen such that the cured polymeric region and unexposed radiation-curable region have a refractive index differential to allow functioning as an optical device.

In an alternative highly preferred embodiment of the present invention, the plastic substrate is protected from said curing energetic radiation by way of a barrier layer opaque to said energetic radiation deposited on said substrate. In one preferred embodiment, the barrier layer comprises a metal film, which may for preference be aluminium.

In an alternative preferred embodiment, the barrier layer comprises a polymer containing an additive that absorbs said energetic radiation. Most preferably, the barrier layer is co-extruded with said plastic substrate.

According to a second aspect, the invention provides a method for photo-patterning a UV-curable polymer optical waveguide supported on a plastic substrate, comprising the steps of:

depositing a UV-curable polymer onto a plastic substrate;
imagewise exposing to UV radiation through a patterning mask, at least a portion of said UV-curable polymer to provide at least one cured polymer region and at least one unexposed UV-curable polymer region,
applying a solvent to remove unexposed UV-curable polymer from said unexposed UV-curable polymer region; and
wherein said plastic substrate is protected from said UV radiation by way of addition to the substrate of an additive selected to absorb UV radiation.

Waveguides so formed are particularly suitable for use as components of an optical touch screen sensor.

According to a third aspect, the invention provides a method for photo-patterning a UV-curable polymer optical waveguide supported on a plastic substrate, comprising the steps of:

depositing a UV-curable polymer onto a plastic substrate;
imagewise exposing to UV radiation through a patterning mask, at least a portion of said UV-curable polymer to provide at least one cured polymer region and at least one unexposed UV-curable polymer region;
applying a solvent to remove unexposed UV-curable polymer from said unexposed UV-curable polymer region; and
wherein said plastic substrate is protected from said UV radiation by a barrier layer opaque to said energetic radiation deposited on said plastic substrate. Most preferably, the barrier layer is co-extruded with said plastic substrate.

Waveguides so formed are particularly suitable for use as components of an optical touch screen sensor.

Regardless of which of the preferred methods is used to protect the substrate, the embodiments of the invention share a number of common preferments.

Preferably, the energetic radiation is UV radiation and the additive is a UV absorber. Most preferably the additive is diffused into the surface of said plastic substrate.

Preferably, the radiation-curable polymer layer comprises at least one monomer, oligomer or polymer bearing at least one functional group capable of undergoing addition polymerisation, and at least one photo-initiator.

Preferably, the at least one functional group is an ethylenically unsaturated group, for example, including but not limited to methacrylate, acrylate, styrene, vinyl, or vinyl ether groups. Alternatively, the at least one functional group is an epoxy group.

Preferably, the radiation-curable polymer comprises a siloxane polymer.

Preferably the at least one photo-initiator is a free radical photo-initiator.

The plastic substrate is preferably polyethylene terephthalate, or equally preferably, a polycarbonate.

In particularly preferred embodiments, the method of the present invention is used for the fabrication of an optical waveguide. Such a method may further comprise the step of depositing a lower cladding layer onto the plastic substrate prior to the deposition of the radiation-curable polymer layer.

Preferably, the lower cladding layer comprises a radiation-curable polymer.

In addition, for the fabrication of optical devices, the method preferably further comprises the step of depositing an upper cladding layer onto the patterned radiation-cured polymer layer.

Preferably, the upper cladding layer comprises a radiation-curable polymer.

In highly preferred embodiments, the optical waveguide forms a component of an optical touch screen sensor.

According to a fourth aspect, the invention provides an optical device comprising:
 a plastic substrate;
 an intermediate barrier layer opaque to energetic radiation; and
 a patterned radiation-cured polymer deposited thereon.

Preferably the plastic substrate is polyethylene terephthalate or a polycarbonate. Preferably the barrier layer is a metal film. Alternatively, the barrier layer comprises a polymer with an additive that absorbs energetic radiation, and the plastic substrate and barrier layer are co-extruded. Preferably the optical device forms part of a waveguide-based optical touch screen sensor.

According to a fifth aspect, the invention provides an optical device comprising:
 a plastic substrate; and
 a patterned radiation-cured polymer deposited thereon;
  wherein the plastic substrate contains an additive that absorbs radiation used to cure the polymer.

Preferably the plastic substrate is polyethylene terephthalate or a polycarbonate.

Preferably the radiation is UV radiation. The additive may be dissolved in, dispersed in or coated on the substrate.

Preferably the optical device forms part of a waveguide-based optical touch screen sensor.

According to a sixth aspect, the invention provides an optical device comprising:
 a plastic substrate;
 an intermediate layer opaque to UV radiation formed by co-extrusion with said plastic substrate; and
 a patterned UV-cured polymer deposited thereon. The invention also provides a waveguide-based optical touch screen sensor comprising such an optical device.

According to a seventh aspect the invention provides an optical device comprising a plastic substrate comprising a UV absorbing additive and having a patterned UV-cured polymer deposited thereon. The invention also provides a waveguide-based optical touch screen sensor comprising such an optical device.

DETAILED DESCRIPTION OF THE INVENTION

The invention provides methods for the photolithographic patterning of features in a photo-curable composition coated onto a plastic substrate. The photo-curable composition comprises at least one free radical polymerisable monomer, oligomer or polymer component, and at least one photo-initiator. The free radical polymerisable monomer, oligomer or polymer component contains at least one reactive group capable of addition polymerisation. Preferably, the reactive group is an ethylenically unsaturated group. Most preferably, the reactive group is a methacrylate, acrylate or styrene group. The photo-initiator is present in sufficient quantity to initiate free radical polymerisation of the polymerisable component, when exposed to energetic radiation. The polymerisable component is present in sufficient quantity to provide contrast when the photo-curable composition is imagewise exposed to sufficient energetic radiation. In one embodiment the contrast takes the form of a refractive index differential. In another, preferred embodiment, the contrast takes the form of a solubility differential such that, when the imagewise exposed composition is rinsed with a suitable solvent developer, the imagewise unexposed regions are removed to leave the imagewise exposed regions. Preferably, the energetic radiation is UV light. Alternatively, the energetic radiation may be visible light, X-rays, electrons or any other radiation sufficiently energetic to initiate polymerisation. Preferably, the photo-curable composition is imagewise exposed with UV light through a mask. Alternatively, the photo-curable composition may be imagewise exposed by scanning a focused beam of UV light across it.

The methods of the invention, concerning photolithographic patterning of a photo-curable composition supported on a plastic substrate, are applicable to the fabrication of any features where precise control of the feature shape is required. The features may, for example, be optical waveguides, microfluidic channels or microlenses. The invention will be described with reference to optical waveguides, although this is non-limiting. In a particular non-limiting application of optical waveguides, U.S. Pat. No. 5,914,709, U.S. Pat. No. 6,181,842 and U.S. Pat. No. 6,351,260 describe an optical touch screen sensor in which optical waveguides are used to launch an array of light beams across a screen, then collect them at the other side of the screen and conduct them to a position-sensitive detector. Touch screen sensors may be used in several consumer electronics devices, and to reduce costs it is advantageous to produce the waveguides on inexpensive plastic substrates. Flexibility may also be an advantage if out-of-plane bending of the substrate is required during product assembly. These waveguides can be advantageously fabricated from photo-curable materials using a photolithography/wet development process.

Several photo-curable materials containing free radical polymerisable monomers, oligomers or polymers suitable for optical waveguide fabrication are known in the art. Multifunctional acrylates and/or methacrylates developed by AlliedSignal and Corning (U.S. Pat. No. 5,462,700, U.S. Pat. No. 6,114,090, U.S. Pat. No. 6,162,579) are one particularly suitable class of photo-curable materials. Siloxane polymers containing ethylenically unsaturated substituents are another particularly suitable class of photo-curable materials, with excellent adhesion to a variety of substrate materials, including silicon, glass and plastics. Siloxane polymers may for example be synthesised by "sol-gel" type hydrolysis/condensation reactions, as disclosed by McGill University (U.S. Pat. No. 6,054,253) and NTT (U.S. Pat. No. 6,632,585). However since these reactions are aqueous-based it can be difficult to remove hydroxyl species that increase the optical absorption in the near infrared region (deleterious for optical waveguide applications). Alternatively, siloxane polymers with negligible hydroxyl content can be synthesised by non-aqueous condensation reactions such as those disclosed in U.S. Pat. No. 6,800,724, U.S. Pat. No. 6,818,721 and U.S. Pat. No. 6,965,006. The ethylenically unsaturated substituents on photo-curable siloxane polymers may for example be methacrylate groups (as in U.S. Pat. No. 6,818,721), styrene groups (as in U.S. Pat. No. 6,727,337) or some other group capable of undergoing free radical addition polymerisation.

The photo-curable materials further comprise at least one free radical generating photo-initiator. Examples of commercially available free radical generating photo-initiators suitable for UV light include 1-hydroxy-cyclohexyl-phenyl-ketone (IRGACURE® 184), 2-methyl-1 [4-methylthio) phenyl]-2-morpholinopropan-1-one (IRGACURE® 907), 2,2-dimethoxy-1,2-diphenylethan-1-one (IRGACURE® 651), 2-benzyl-2-dimethylamino-1-(4-morpholinophenyl)-butanone-1 (IRGACURE® 369), 4-(dimethylamino)benzophenone, 2-hydroxy-2-methyl-1-phenyl-propan-1-one (DAROCUR® 1173), benzophenone (DAROCUR® BP), 1-[4-(2-hydroxyethoxy)-phenyl]-2-hydroxy-2-methyl-1-propane-1-one (IRGACURE® 2959), 4,4'-bis(diethylamino) benzophenone (DEAB), 2-chlorothioxanthone, 2-methylthioxanthone, 2-isopropylthioxanthone, benzoin and 4,4'-dimethoxybenzoin. For curing with visible light, camphorquinone may be used as a photo-initiator. A mixture of two or more photo-initiators may also be used. For example, IRGACURE® 1000 is a mixture of 80% DAROCUR® 1173 and 20% IRGACURE® 184. The photo-initiator may be present at a level from 0.01% to 10% by weight of the overall composition, more preferably from 0.5% to 4% by weight of the overall composition.

Other additives, such as stabilisers, plasticisers, contrast enhancers, dyes or fillers may be added to enhance the properties of the photo-curable polymer as required.

Figure 1A:
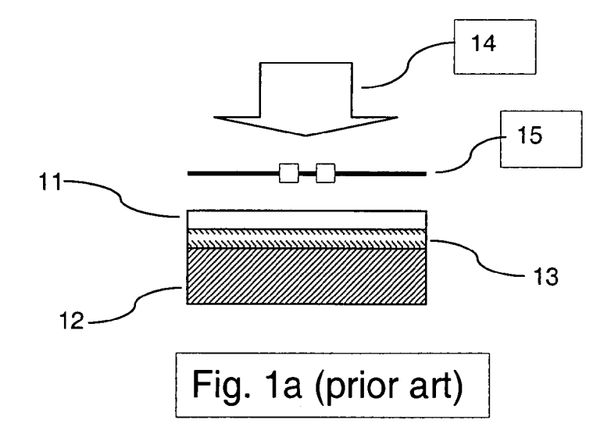
FIG. 1a to 1d illustrate the general method of patterning of a photo-curable polymer layer with a photolithography/wet etch method.
Figure 1B:
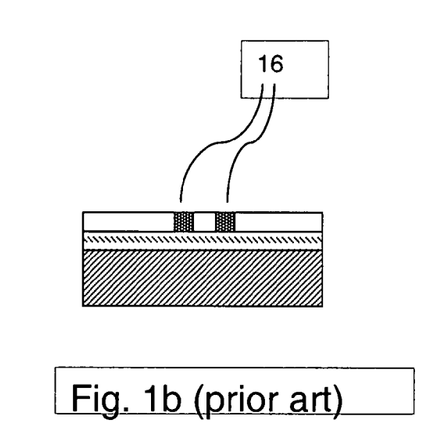
Figure 1C:
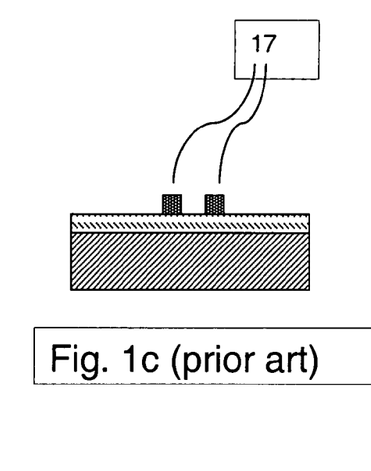
Figure 1D:
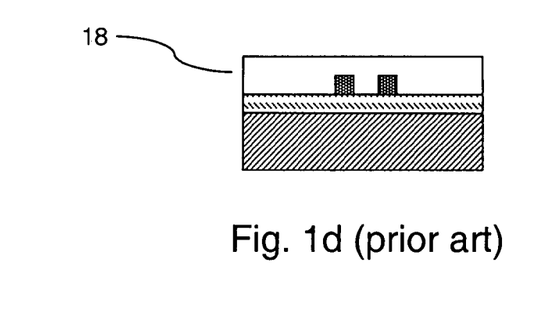
Figure 2:
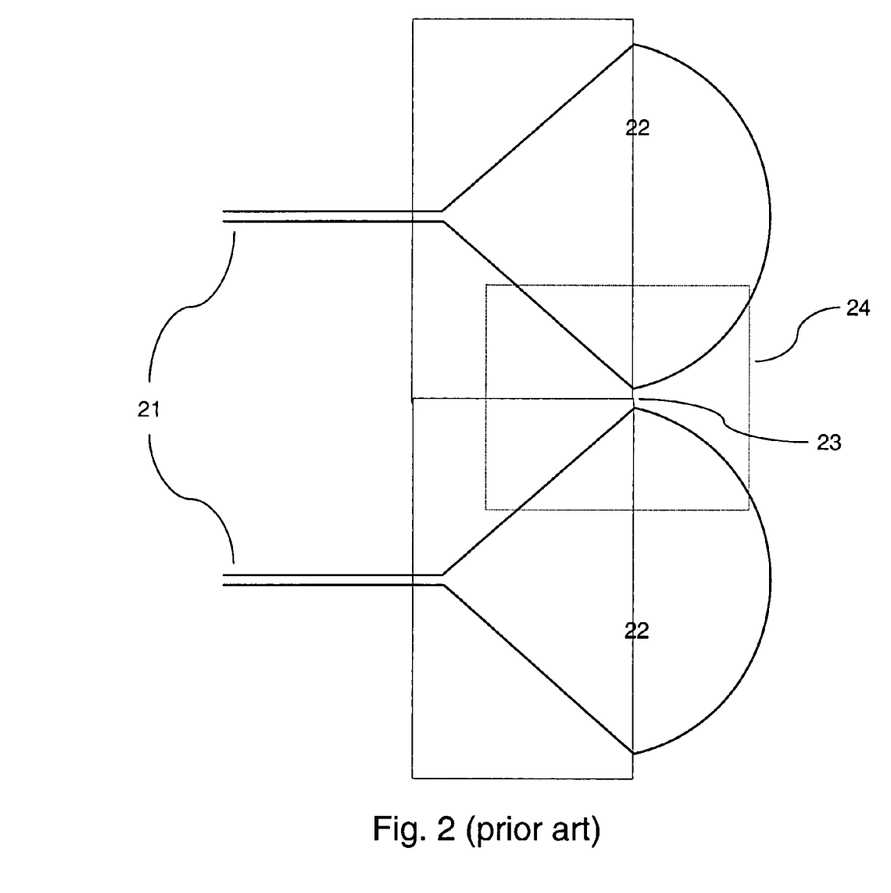
FIG. 2 is a schematic of two adjacent waveguides with unitary lenses.

The following examples describe the fabrication via imagewise UV exposure of an array of closely spaced parallel waveguides with unitary planar lenses in a photo-curable siloxane polymer deposited on a variety of substrates. Such waveguide/lens arrays may find application in waveguide-based optical touch screen sensors. FIG. 2 shows a plan view of two such waveguides 21 with unitary lenses 22 separated by a gap 23 of width 50 µm. Dotted box 24 indicates the approximate area covered by the photographs presented with certain examples.

Example 1

Conventional Method of Coating on Silicon Substrate

Following the procedure disclosed in U.S. Pat. No. 6,818,721, a lower refractive index polymer A was prepared with a viscosity of 2500 cP (at 20° C.) and a refractive index (measured at 20° C. on an Abbe refractometer with room light) of 1.483. A higher refractive index polymer B was prepared with a viscosity of 2200 cP (at 20° C.) and a refractive index of 1.509 (at 20° C.). The free radical generating photo-initiator IRGACURE® 369 was added to both polymer A and polymer B at a level of 2 wt %. Methacrylate-containing substituents were borne by 25% of the silicon atoms in polymers A and B.

Figure 3:
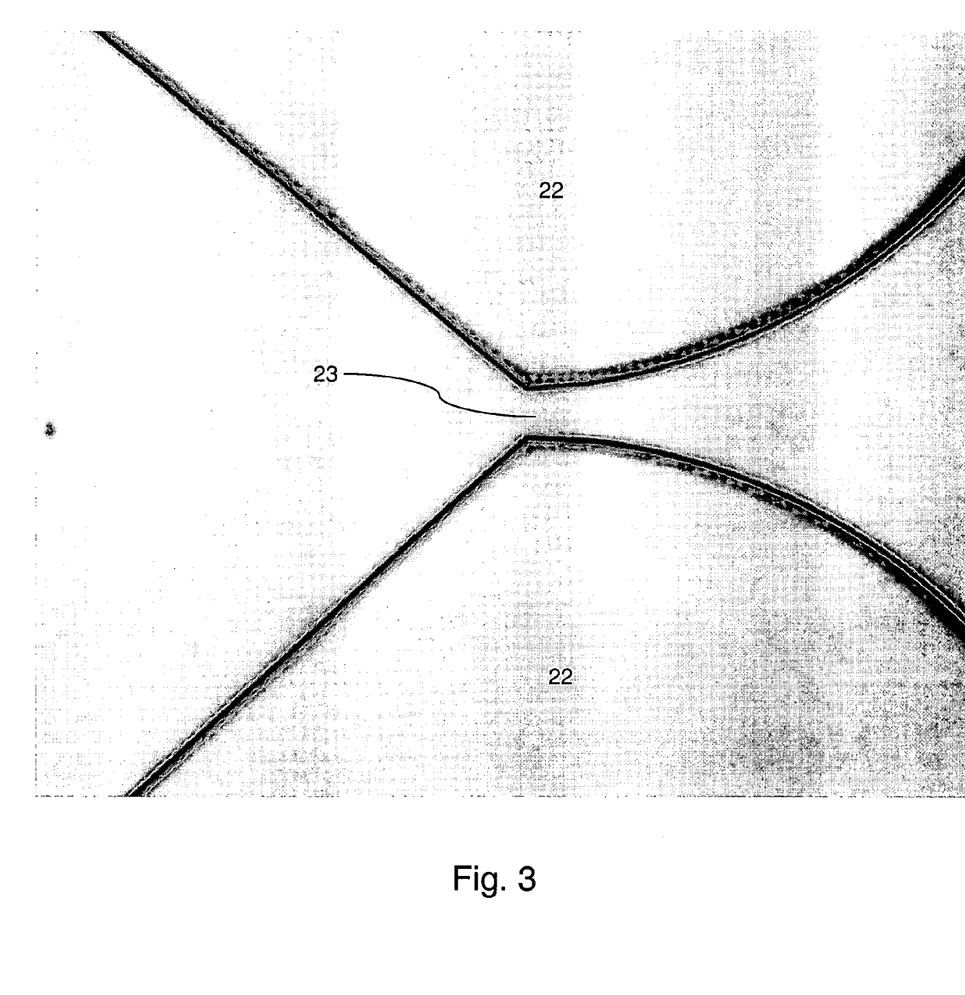
FIG. 3 is a photograph of the gap region between two lenses patterned from a photo-curable polymer deposited on a silicon substrate using a conventional technique.

Polymer A was spin coated onto a silicon wafer and cured with UV light from a mercury lamp in an Oriel flood illuminator to form a lower cladding layer 20 µm thick and with a refractive index of 1.478 (at 20° C. and 1550 nm). Polymer B was spin coated onto the lower cladding to form a core layer 11 µm thick, and imagewise exposed to UV light through a mask in a Canon MPA500 photolithography tool. Unexposed polymer B material was then dissolved in isopropanol to leave exposed material in the form of an array of waveguides with unitary planar lenses. Exposed polymer B material had a refractive index of 1.505 (at 20° C. and 1550 nm). A photograph (FIG. 3) shows that the lenses 22 have smooth sidewalls and there is no evidence of undesirable polymerised material (i.e. "gap filling") in gap 23 between the lenses.

Example 2

Conventional Method of Coating on Polycarbonate Substrate

Figure 4:
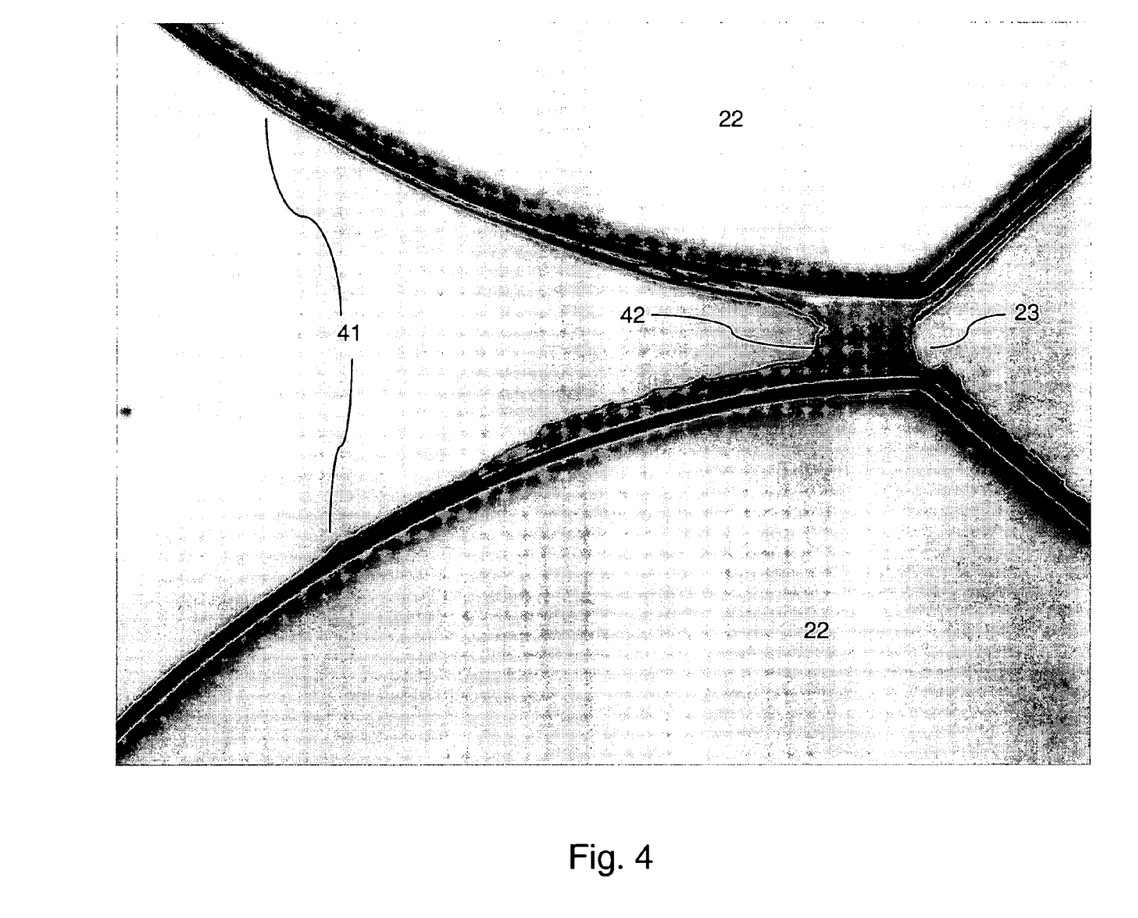
FIG. 4 is a photograph of the gap region between two lenses patterned from a photo-curable polymer deposited on a polycarbonate substrate using a conventional technique.

The processing conditions in this example are identical to those in Example 1 except that the substrate was polycarbonate (DE1-1, BAYER®) instead of silicon. In this case a photograph (FIG. 4) shows roughness 41 on the sidewalls of lenses 22 and a considerable amount of polymerised material 42 in gap 23 between the lenses.

Example 3

Conventional Method of Coating on Pet Substrate

Figure 5:
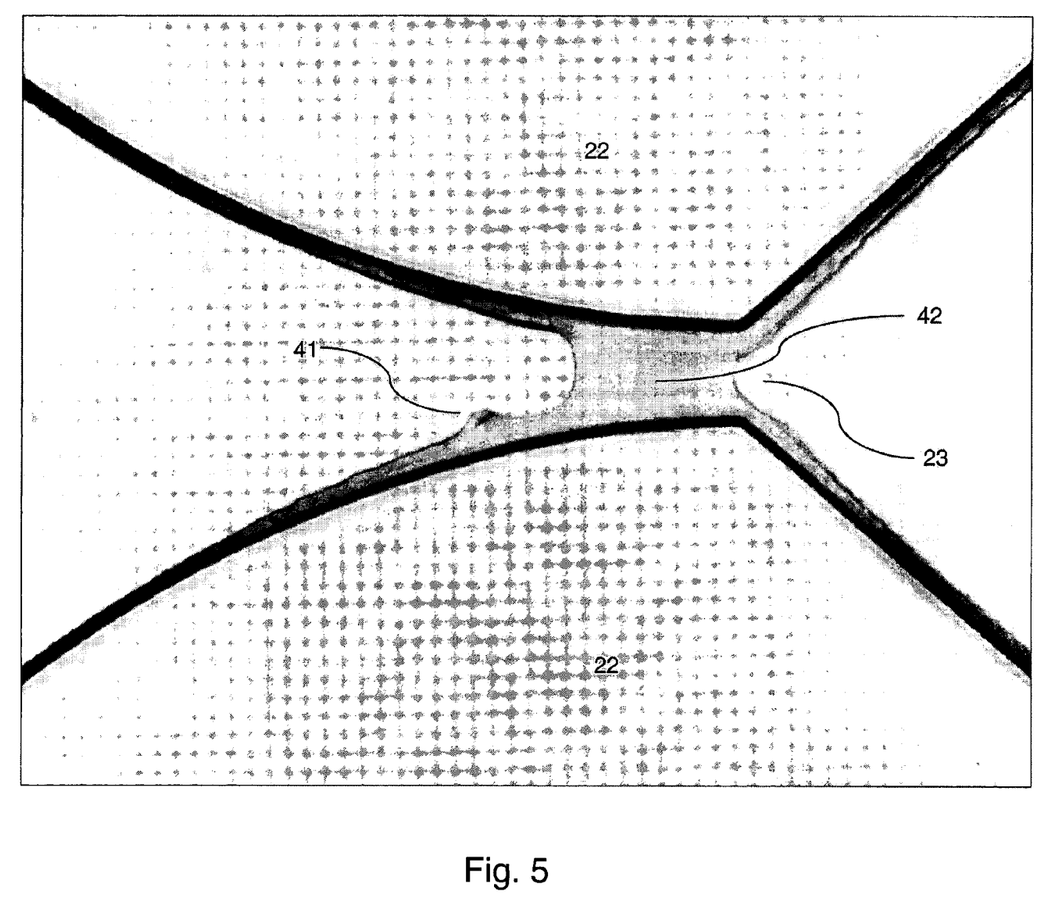
FIG. 5 is a photograph of the gap region between two lenses patterned from a photo-curable polymer deposited on a polyethylene terephthalate (PET) substrate using a conventional technique.

The processing conditions in this example are identical to those in Example 1 except that the substrate was PET (ME- LINEX® 518, Dupont) instead of silicon. Similar to the case of Example 2, a photograph (FIG. 5) shows roughness 41 on the sidewalls of lenses 22 and a considerable amount of polymerised material 42 in gap 23 between the lenses.

The effect caused by the change of substrate from silicon to PET or polycarbonate was surprising and striking. In some manner, changing from a silicon substrate to a plastic substrate has altered the polymerisation dynamics of the curable composition. The ability to photo-imprint features with high contrast depends, among other factors, on the balance between the rate of free radical generation and the rate of free radical scavenging by oxygen dissolved or present in the photo-curable material. Without wishing to be bound by theory, it is believed that the presence of the plastic has somehow reduced the oxygen content in photo-curable polymer B during the photo-patterning process. When a film of photo-curable material coated on a substrate is exposed to UV light during photo-patterning, partial UV exposure of the substrate also occurs. Again without wishing to be bound by theory, it is believed that additives in the plastic substrate, such as light stabilisers, are activated by UV exposure and consume oxygen in their operation. It is known, for example, that many hindered amines (a broad class of light stabilisers) operate with an initial oxidation step (Ciba Specialty Chemicals Publication No. 016195.00.40, "Additives for Trade Sales and Industrial Coatings"). Among polymers, siloxanes (also known as silicones) are well known to have high oxygen permeabilities, certainly higher than in plastics commonly used as substrates in the display industry. The oxygen permeability P of PET is particularly low, of order $10^{-15}$ $cm^3(STP) \cdot cm^{-1} \cdot Pa^{-1} \cdot s^{-1}$ at 25° C., while for polycarbonate polymers P is of order $10^{-14}$ $cm^3(STP) \cdot cm^{-1} \cdot Pa^{-1} \cdot s^{-1}$. In contrast, P for siloxane polymers is typically of order $10^{-11}$ $cm^3(STP) \cdot cm^{-1} \cdot Pa^{-1} \cdot s^{-1}$ (Polymer Handbook, $4^{th}$ edition, eds. J. Brandrup, E. H. Immergut & E. A. Grulke, John Wiley & Sons, 1999, pp. VI/543-VI/1569). Because of the much higher oxygen permeability of siloxane polymers, it is believed that when UV exposure initiates oxygen-depleting reactions in the surface layer of the plastic substrate, the oxygen is replenished by rapid diffusion through the overlying siloxane film rather than by slow diffusion through the plastic. Since the UV exposure is also depleting the oxygen concentration in the siloxane (by generating free radicals that react with oxygen), this additional substrate-related oxygen depletion alters the free radical generation/consumption balance, allowing polymerisation to continue outside the imagewise exposed regions. In photolithography terms, the process window has been closed.

The present invention addresses methods of controlling this oxygen depletion effect, by preventing the UV light from interacting deleteriously with the plastic substrate. In one embodiment the invention provides a method of interposing between the siloxane polymer and the substrate an intervening layer, in the form of a blocking or reflective layer such as a metallic barrier. Such materials are readily produced by evaporating aluminium onto the plastic in a reel-to-reel process, and are widely used for packaging in the food industry for example.

Example 4

Inventive Method of Coating on Pet Substrate

The processing conditions in this example are identical to those in Example 1 except that the substrate was PET (MELINEX® 518, Dupont) with a 200 nm thick sputter-coated layer of aluminium on the surface. Similar to the results of Example 1, the lenses had smooth sidewalls and there was no evidence of gap filling, suggesting that the oxygen depletion effect has been controlled.

In another embodiment of this invention the plastic substrate is coated or co-extruded with a polymer barrier layer containing a UV absorber, to reduce the transmission of UV light to the substrate. Many suitable UV absorbers for polymers are available, such as TINUVIN® 384-2 or TINUVIN®171 from Ciba Geigy. An example of a commercially available plastic co-extruded with a UV absorbing barrier layer is the polycarbonate MAKROLON® UV from BAYER®.

Example 5

Figure 6:
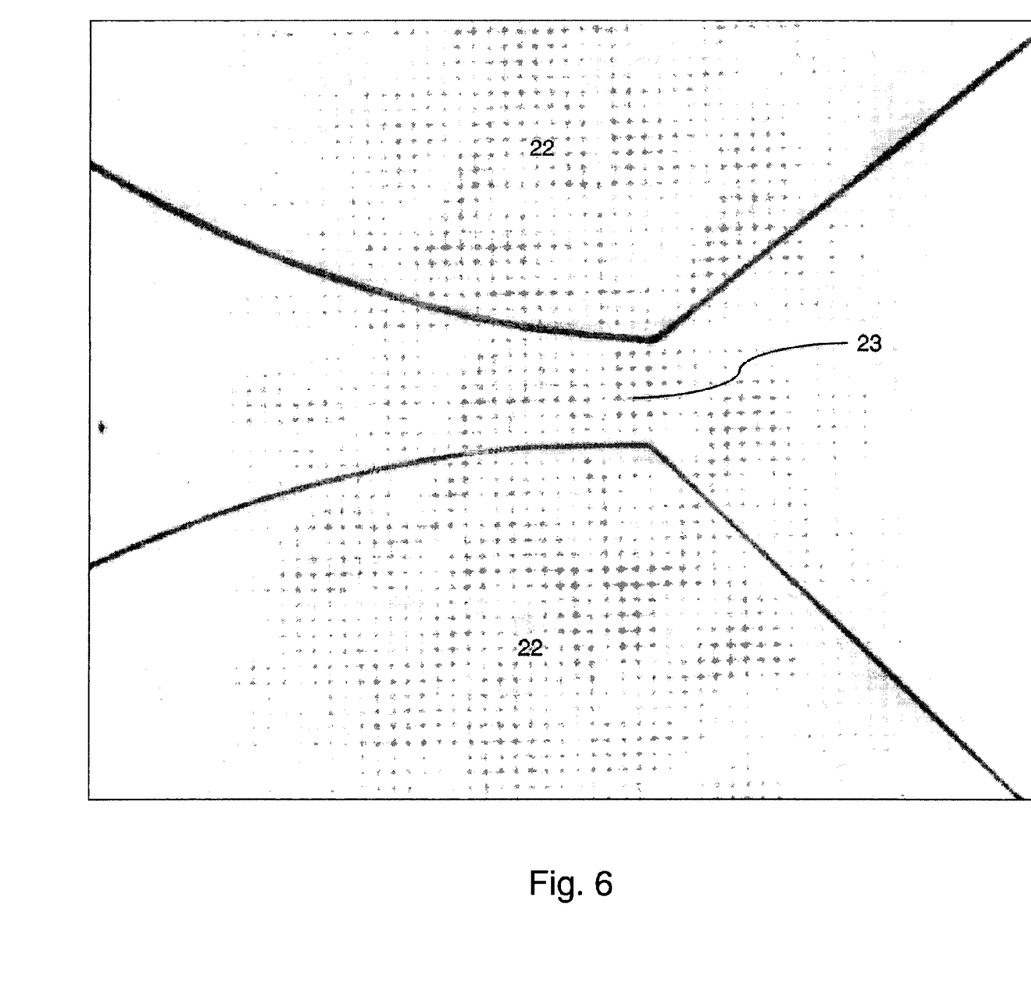
FIG. 6 is a photograph of the gap region between two lenses patterned from a photo-curable polymer deposited on a polycarbonate substrate co-extruded with a UV absorbing plastic layer using the technique of the present invention.

Inventive Method of Coating on Polycarbonate Substrate Co-Extruded with UV Absorbing Barrier Layer The processing conditions in this example are identical to those in Example 1 except that instead of silicon, the substrate was the polycarbonate MAKROLON® UV from BAYER® with a co-extruded UV absorbing layer. Similar to the result of Example 1, and in contrast to the result of Example 2, a photograph (FIG. 6) shows that the lenses 22 have smooth sidewalls and there is no evidence of undesirable polymerised material (i.e. "gap filling") in gap 23 between the lenses.

In a further embodiment, a blocking layer and an absorbing layer may be used in combination, e.g. metallisation of the substrate followed by deposition and curing of a UV absorbing barrier layer, or metallisation of a plastic substrate co-extruded with a UV absorbing layer.

In yet a further embodiment, the plastic substrate contains an intrinsic UV absorber, either distributed throughout the substrate or present only in a surface layer of the substrate. When a plastic substrate of this type is exposed to UV radiation during patterning of the core polymer layer, any UV radiation that penetrates to the substrate is absorbed in a region close to the surface of the substrate. Generally, this incident energy is converted to heat and does not initiate processes (free radical or otherwise) that may affect the oxygen concentration in the vicinity of the photo-patterning. Two examples of commercially available plastics containing an intrinsic UV absorber are MELINEX® 943 from Dupont and COURTGUARD® UV protective films from CPFilms, both of which are PET based.

Example 6

Inventive Method of Coating on UV Absorbing Pet Substrate

Figure 7:
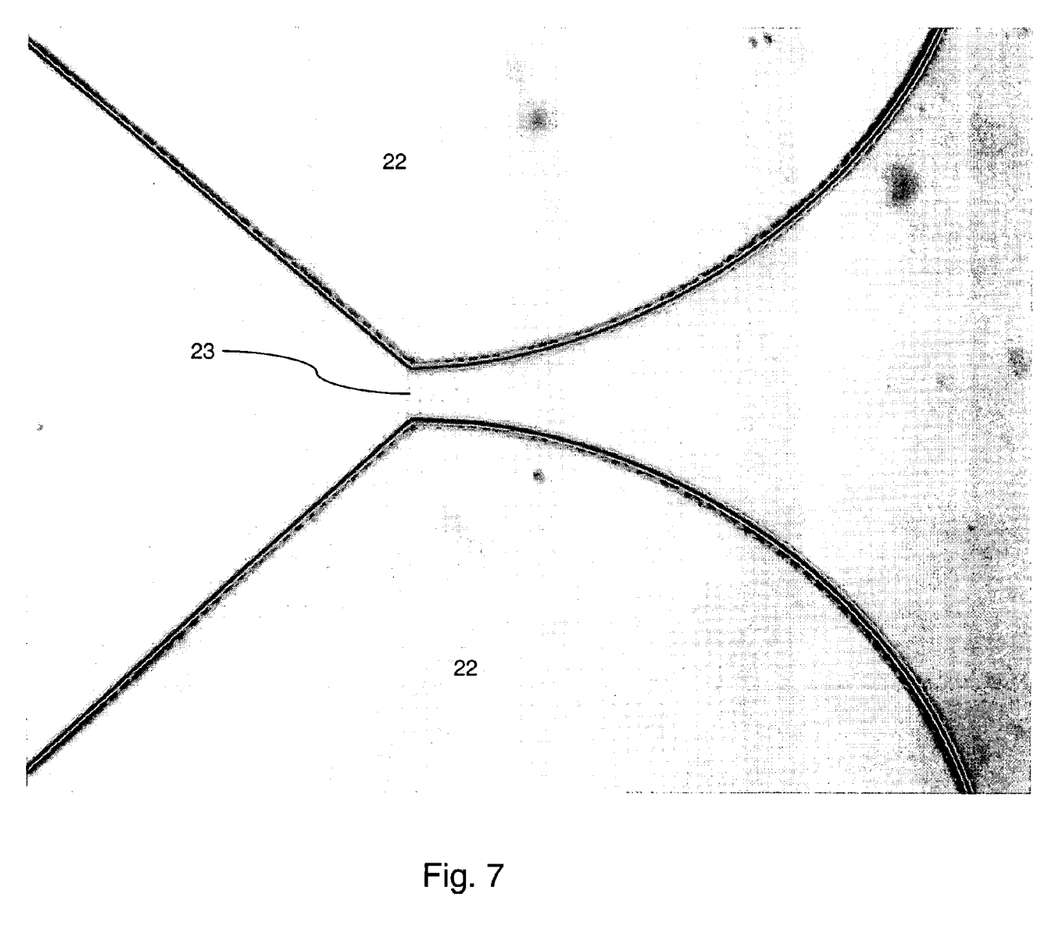
FIG. 7 is a photograph of the gap region between two lenses patterned from a photo-curable polymer deposited on a PET substrate containing a UV absorber using the technique of the present invention.

The processing conditions in this example are identical to those in Example 1 except that the substrate was a grade of PET containing a UV absorber (CPFilms COURTGUARD® on Dupont MELINEX® 454) instead of silicon. Similar to the results of Examples 1 and 5, and in contrast to the result of Example 3, a photograph (FIG. 7) shows that the lenses 22 have smooth sidewalls and there is no evidence of undesirable polymerised material (i.e. "gap filling") in gap 23 between the lenses.

In the present invention, plastic substrates either having a coating containing a UV absorbing species, or having a UV absorbing species dispersed or grafted therein are particularly preferred. These embodiments are to be distinguished from the use of anti-reflection coatings in photolithography. It is known in the art of UV photolithography ("Introduction to Microlithography: Theory, Materials and Processing", ed. L. F. Thompson, C. G. Willson & M. J. Bowden, ACS Symposium Series 219, American Chemical Society 1983, pp. 44-46) that standing waves caused by reflection of the UV radiation off a highly reflective substrate (such as silicon) can interfere with the photo-patterning process. This standing wave effect has been prevented in the prior art by depositing an anti-reflection coating onto the substrate, with the thickness and refractive index of the coating chosen such that destructive interference prevents reflection of the UV light back into the material being patterned. The anti-reflection coating material may also be absorbing of the UV light, however those skilled in the art will understand that this absorption is not sufficient to prevent reflection, but rather the reflection is primarily prevented by destructive interference. The protective coatings of the present invention are intended to prevent UV light from penetrating into the substrate, not to prevent it from being reflected back into the material being photo-patterned. Furthermore, it will be appreciated that the patterning problems demonstrated in Examples 2 and 3 are extremely unlikely to be due to a standing wave effect, since the refractive index contrast between the photo-patternable polymer and the plastic substrate will be small; therefore the barrier coatings that rectified the problem in Examples 4 and 5 are not acting as anti-reflection coatings. Indeed, the photo-patterning was perfectly acceptable in Examples 1 and 4, where the substrate was highly reflective (silicon and aluminium-coated plastic respectively). In another point of difference between the protective coatings of the present invention and anti-reflection coatings of the prior art, the anti-reflection coatings, relying on destructive interference, can in general only be designed for photo-patterning with a narrow range of UV wavelengths, say the i-line of a mercury lamp. In contrast, the protective coatings of the present invention, whether they be reflective (e.g. a metal film) or absorbing (e.g. a polymer film doped with a UV absorber) offer protection for a wide range of UV wavelengths, enabling for example photo-patterning with multiple lines of a mercury lamp.

Although the invention has been described with reference to specific examples it will be appreciated by those skilled in the art that the invention may be embodied in many other forms.

We claim:

1. A method for patterning a radiation-curable polymer supported on a plastic substrate, comprising the steps of
   depositing a radiation-curable polymer onto a plastic substrate; and
   imagewise exposing to curing energetic radiation, at least a portion of said radiation-curable polymer to provide a cured polymer region and an unexposed polymer region, wherein said plastic substrate is shielded from said radiation by one or more shielding means selected from the group consisting of: i) an additive designed to absorb said energetic radiation; and ii) a barrier layer opaque to said energetic radiation, wherein said barrier layer is between said radiation-curable polymer and said substrate, wherein said plastic substrate is chosen from a group consisting of: polyethylene terephthalate and a polycarbonate, wherein said radiation-curable polymer is a siloxane polymer; and
   allowing the shielding means to shield the plastic substrate from the radiation to prevent gap filling between cured polymer regions or undesirable roughness at the boundary of said cured polymer regions.
2. A method according to claim 1 wherein said radiation-curable polymer layer comprises at least one monomer, oligomer or polymer bearing at least one functional group capable of undergoing addition polymerisation, and at least one photo-initiator.
3. A method according to claim 2, wherein the at least one photo-initiator is a free radical photo-initiator.
4. A method according to claim 1 wherein the cured polymer region and the unexposed radiation-curable polymer region have a refractive index differential of at least 0.003.
5. A method according to claim 1, further comprising the step of applying a solvent to remove said unexposed polymer region.
6. A method according to claim 1, wherein said additive is diffused into the surface of said plastic substrate.
7. A method according to claim 2, wherein the at least one functional group is an ethylenically unsaturated group.
8. A method according to claim 7, wherein the ethylenically unsaturated group is selected from methacrylate, acrylate, styrene, vinyl, or vinyl ether groups.
9. A method according to claim 2, wherein the at least one functional group is an epoxy group.
10. A method according to claim 1, further comprising the step of depositing a lower cladding layer onto the plastic substrate prior to the deposition of the radiation-curable polymer layer.
11. A method according to claim 10, wherein said lower cladding layer comprises a radiation-curable polymer.
12. A method according to claim 1, further comprising a step of depositing an upper cladding layer onto the patterned radiation-cured polymer layer.
13. A method according to claim 12, wherein said upper cladding layer comprises a radiation-curable polymer.
14. A method according to claim 1, wherein said barrier layer comprises a metal film.
15. A method according to claim 1, wherein said barrier layer comprise a polymer containing an additive that absorbs said energetic radiation.
16. A method according to claim 15, wherein said barrier layer is co-extruded with said plastic substrate.
17. A method for photo-patterning a UV-curable polymer supported on a plastic substrate, comprising the steps of:
   depositing a UV-curable polymer onto a plastic substrate;
   imagewise exposing to UV radiation through a patterning mask, at least a portion of said UV-curable polymer to provide at least one cured polymer region and at least one unexposed UV-curable polymer region;
   allowing the plastic substrate to be shielded from the radiation by adding to the substrate an additive selected to absorb UV to prevent gap filling between cured polymer regions or undesirable roughness at the boundary of said cured polymer regions; and
   applying a solvent to remove unexposed UV-curable polymer from said unexposed UV-curable polymer region; wherein said plastic substrate is chosen from a group consisting of: polyethylene terephthalate and a polycarbonate, wherein said UV-curable polymer is a siloxane polymer.
18. A method for photo-patterning a UV-curable polymer supported on a plastic substrate, comprising the steps of:
   depositing a UV curable polymer onto a plastic substrate;
   imagewise exposing to UV radiation through a patterning mask, at least a portion of said UV-curable polymer to provide at least one cured polymer region and at least one unexposed UV-curable polymer region;
   allowing the plastic substrate to be shielded from the radiation by a barrier layer opaque to said UV to prevent gap filling between cured polymer regions or undesirable roughness at the boundary of said cured polymer regions; and applying a solvent to remove unexposed UV-curable polymer from said unexposed UV-curable polymer region; wherein said barrier layer is between said UV-curable polymer and said substrate, wherein said plastic substrate is chosen from a group consisting of: polyethylene terephthalate and a polycarbonate, wherein said UV-curable polymer is a siloxane polymer.

19. A method according to claim 18, wherein said barrier layer comprises a metal film.

20. A method according to claim 18, wherein said barrier layer comprises a polymer with an additive that absorbs UV radiation.

21. A method according to claim 20, wherein said barrier layer is co-extruded with said plastic substrate.

* * * * *